United States Patent
Degani et al.

[11] Patent Number: 6,100,475
[45] Date of Patent: *Aug. 8, 2000

[54] SOLDER BONDING PRINTED CIRCUIT BOARDS

[75] Inventors: Yinon Degani, Highland Park; King Lien Tai, Berkeley Heights, both of N.J.

[73] Assignee: Lucent Technologies, Inc., Murray Hill, N.J.

[ * ] Notice: This patent is subject to a terminal disclaimer.

[21] Appl. No.: 09/067,271

[22] Filed: Apr. 27, 1998

Related U.S. Application Data

[63] Continuation-in-part of application No. 09/041,157, Mar. 12, 1998, Pat. No. 6,013,877.

[51] Int. Cl.[7] ............................. H05K 1/11; B23K 31/00
[52] U.S. Cl. .................. 174/264; 228/180.22; 228/187; 361/779; 438/613
[58] Field of Search ................................... 174/263, 264; 228/180.22, 180.21, 187; 361/746, 774, 779; 438/109, 612, 613; 439/83

[56] References Cited

U.S. PATENT DOCUMENTS

| | | | |
|---|---|---|---|
| 4,830,264 | 5/1989 | Bitaillou et al. | 228/180.2 |
| 5,275,330 | 1/1994 | Issacs et al. | 228/180.2 |
| 5,337,219 | 8/1994 | Carr et al. | 361/794 |

*Primary Examiner*—Hyung-Sub Sough
*Attorney, Agent, or Firm*—Peter V. D. Wilde; Thomas, Kayden, Horstemeyer & Risley LLP

[57] ABSTRACT

The specification describes techniques for attaching double sided circuit boards having plated through holes to interconnection substrates using solder bump arrays. The through holes are filled with a high melting point solder which allows solder bumps to be located directly on the through hole thus saving board area and reducing the interconnection length.

13 Claims, 2 Drawing Sheets

SOLDER BONDING PRINTED CIRCUIT BOARDS

RELATED APPLICATION

This application is a continuation-in-part of application Ser. No. 041,157, (Degani et al 40-55), filed Mar. 12, 1998, now U.S. Pat. No. 6,013,877.

FIELD OF THE INVENTION

This invention relates to electronic assembly technology and more specifically to solder interconnections used in fabricating multiple interconnect substrates and bonding them together.

BACKGROUND OF THE INVENTION

Solder bump interconnection techniques for both electrically contacting component packages and mounting them on interconnection substrates such as printed circuit boards have become widely used in the manufacture of electronic devices. The generic term interconnection substrates includes several forms of electronic device supports including, e.g., epoxy boards and ceramic substrates. For convenience, reference herein to such supports will be to printed circuit boards as a generic term.

State of the art component packages frequently include one or more double sided circuit boards, with the double sided circuit board solder bump bonded to another support structure, typically another printed circuit board. Contact pads are formed on both printed circuit boards in mirror arrays that mate when the boards are properly aligned together. Each of the contact surfaces on one or the other array of contact pads is provided with a body of solder in the form of a ball, or thick localized solder layer. Assembly is completed by applying heat to melt the solder and form the solder bond and interconnection between the arrays of contact pads. The solder can be in a variety of forms, e.g. bumps, balls, pads and other forms of thick layers including printed solder paste layers, and the term solder bump is used generically in this description to refer to any of these forms of solder bodies.

Double circuit boards are standard parts used in the fabrication of multi-chip module or ball grid array components. The double sided boards are provided with through hole connections typically made by drilling holes through the board and plating the interior of the hole with a conductive metal, e.g. copper. Contact areas, usually referred to as capture pads, are provided on both sides of the through hole to interconnect circuits runners on one side of the board with circuit runners on the other side. The contact areas are aligned to the through holes, or vice versa, as closely as the alignment tolerances permit but are typically significantly larger than the holes to ensure registration.

The through hole sites, consisting of the contact areas just described, are located along the edges of the printed circuit board in edge arrayed interconnection schemes, or may be located at any site on the printed circuit board in area array interconnection arrangements. In both cases the through hole sites are forbidden regions for solder bump interconnections between boards. This is due to the tendency of the solder to wick into the through hole when the solder bumps are melted during solder bump bonding. To avoid the wicking problem, solder bumps interconnections are typically offset laterally from the through hole, and a separate printed circuit interconnection is provided between the solder bump and the through hole. The interconnection efficiency is reduced in such arrangements, and the board area required for the added printed circuit features is increased.

To overcome the necessity of isolating through holes and solder bumps it has been proposed to cover one side of the through hole with, e.g. a solder mask, and apply the solder bump to the other side. This prevents wicking of the solder into the through hole, but results in a build-up of pressure in the through hole on heating of the assembly. The pressure is due to a combination of solder flux vapor and air expanding in a confined space, and may result in a large void and in extreme cases blowout of the solder bump.

A technique for avoiding wicking of solder bumps into through holes on double sided circuit boards would allow the interconnect area to be more efficiently utilized, and would allow shorter interconnections and improved electrical efficiency.

SUMMARY OF THE INVENTION

We have devised a technique for solder bump fabrication and bonding of double sided printed circuit boards wherein one or more solder bumps are located directly on plated through hole contacts. The problem of solder wicking is avoided by filling the plated through hole with a high melting solder prior to solder bump bonding.

DETAILED DESCRIPTION

Figure 1:
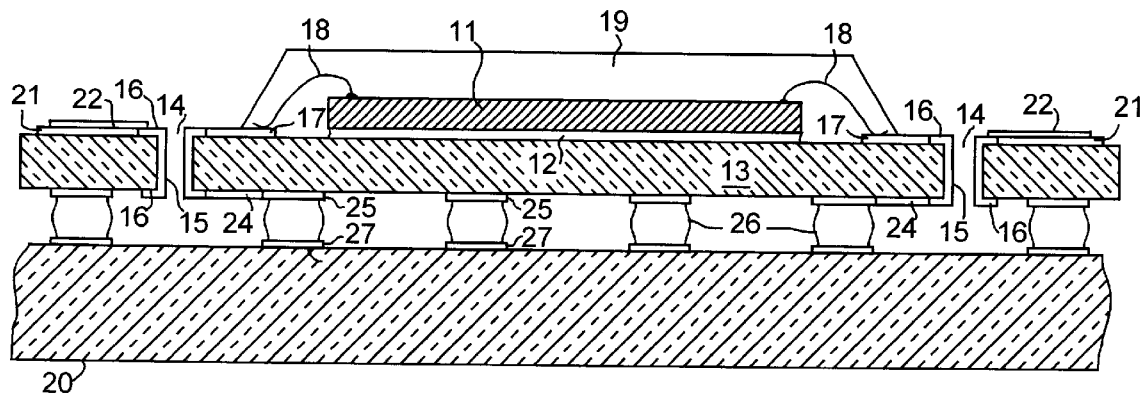
FIG. 1 is a schematic sectional view of a typical double sided printed circuit board with the through holes and the solder bump interconnections offset.

With reference to FIG. 1, a conventional double sided printed circuit board 13 is shown solder bump bonded with solder bumps 26 to an interconnection substrate 20. The solder bumps are provided with conventional contact pads or UBM pads 25 and 27. Typically the double sided board with through holes has copper printed circuits and the contact pads 25 are copper.

Circuit board 13 has IC chip 11 bonded to the top side of the board with epoxy 12. The chip is electrically interconnected to circuit 17 on the board via wire bonds 18. The chip is encapsulated with a standard plastic encapsulant 19. The board 13 is provided with through hole interconnections 14 which include plating 15 inside the through hole interconnecting an interconnection site on the top side of the circuit board with an interconnection site on the bottom side of the circuit board. The interconnection sites comprise contacts pads 16 surrounding the plated through holes. Circuits 21 are shown on the top side of the board. Circuits may also be provided on the bottom of the board (not shown). The circuits on the top side of the board are protected during the soldering operation by solder mask 22. The plated through holes 14 interconnect the chip 11 with substrate 20 via wire bonds 18, printed circuit section 17, plated through hole contact pads 16 and plating 15, printed circuit section 24 on the lower side of the double sided board 13, contacts 25, solder bumps 26 and contacts 27. The solder bumps are deliberately offset laterally from the region of the through holes to prevent wicking and preserve the integrity of the solder bumps. Printed circuit portion 24 is required therefore to interconnect the offset solder bumps 26 and through holes 14.

Figure 2:
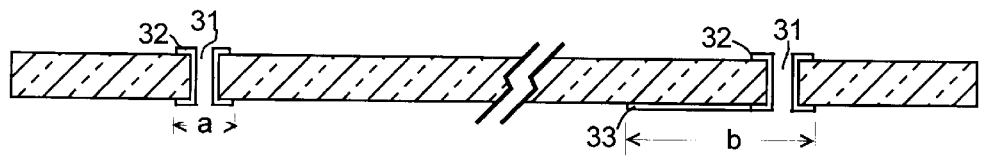
FIG. 2 is a section view comparing the interconnection feature dimensions of the prior art and the invention.

It would be advantageous to have the design option of positioning the solder bumps directly on the through hole contacts 16. This expedient would save board space and reduce the length of the interconnections by eliminating the printed circuit portion 24 in FIG. 1. A comparison between this desirable expedient, and the conventionally used arrangement is shown in FIG. 2. Here the through holes 31 are shown with surrounding contact pad 32. If the solder bump is located directly on the through hole contact pad 32, the required board area is defined approximately by dimension "a" as shown on the left though hole. With the requirement that the through hole and the solder bump be offset, the board region required for the solder bump is defined by dimension "b". The length of the offset interconnect is larger by b–½a.

Figure 3:
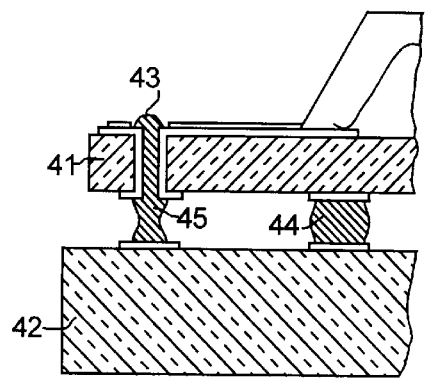
FIGS. 3 and 4 are schematic representations of solder bump bonded double sided printed circuit boards that describe the problems overcome by the invention.

If, following conventional practice, the solder bumps are moved to contact the through hole contact directly, the problem illustrated in FIG. 3 arises. In FIG. 3 the double sided board 41 is shown solder bump bonded to substrate 42 with solder bumps 44 and 45. The solder bump 45 in FIG. 3 is co-located with through hole 43. The problem of wicking of the solder when the solder melts during bonding is evident, and distortion/destruction of the solder bump 45 results.

Figure 4:
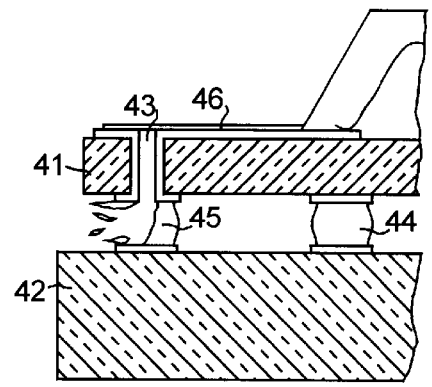

In an attempt to overcome the wicking problem, the through hole can be covered, as shown in FIG. 4. A solder mask 46 can be used to cover through hole 43. The result, as shown, is that when the solder bump is heated to melt the solder and effect the bond, flux residues in the through hole vaporize, and air that is trapped in the "plugged" hole 43 expands, both of which contribute to "ballooning" of the solder bump and possibly blowout as shown in FIG. 4.

Figure 5:
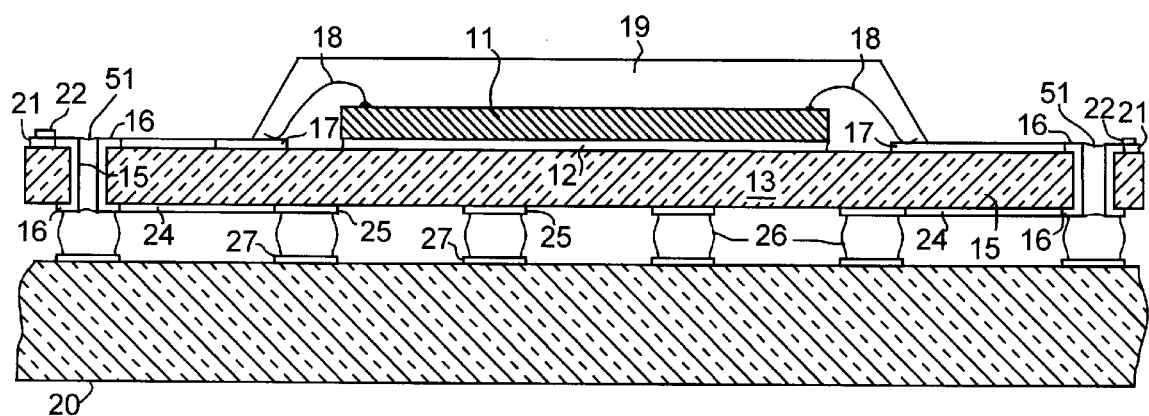
FIG. 5 is a schematic view of a ball grid array package using the technique of the invention to co-locate solder bump bonds and through hole interconnections.

To overcome this problem, according to the invention, the through holes are completely plugged, as shown at 51 in FIG. 5, with solder. This effectively eliminates the problems described in connection with FIGS. 3 and 4 and allows coincident positioning of solder bumps and through holes. The solder used for the through holes has a melting point higher than the melting point of the solder used for bonding elements of the assembly and is thus referred to herein, in relative terms, as the high melting point solder.

Those skilled in the art will recognize that the invention takes advantage of the phenomenon that causes the problem, i.e. wicking of solder into through holes. The invention deliberately wicks solder into the through holes, but the choice of a high melting point solder is the key to eliminating the problem. It is also evident that partial wicking of the high melting point solder will confer some benefits if it is wicked from the solder bump side of the through hole. Therefore the preferred technique is to apply the high melting point solder to the solder bumped side of the board. This ensures that in the event of only partial filling of the through hole the purpose of the invention will still be served. If only partial filling does occur in some instances blowout may still be avoided due to the fact that molten lower melting point solder will wet the surface of the plugging higher melting point solder and drive the trapped air and flux away from the hole. However, in many applications of the invention the through holes will completely fill due to the wetting properties of the solder, which allows solder bumps to be positioned over the through holes on the solder bumped side of the board, and allows soldered components or I/O pads to be positioned on, or closely to, through holes on the top side of the board. In this way the length of through hole interconnections is determined by the thickness of the board, i.e. the optimum interconnection length. For purposes of defining the invention, the stated step of filling the plated through holes with solder is intended to mean blocking the hole cross section, which includes filling all, or a portion, of the hole depth.

The solder bumps can be formed by any suitable technique such as ball placement and solder paste printing. The thickness of a typical solder bump for this application is 5–30 mils. Examples of solder compositions that can be used successfully in the processes described above are:

| SOLDER A - BONDING SOLDER | | | | | |
|---|---|---|---|---|---|
| composition | Sn | Pb | Bi | solidus ° C. | liquidus ° C. |
| I | 63 | 37 | | 183 | 183 |
| II | 42 | | 58 | 138 | 138 |
| III | 43 | 43 | 14 | 143 | 163 |

| SOLDER B - THROUGH HOLE SOLDER | | | | | | |
|---|---|---|---|---|---|---|
| composition | Sn | Pb | Ag | Sb | solidus ° C. | liquidus ° C. |
| I | 30 | 70 | | | 183 | 257 |
| II | 40 | 60 | | | 183 | 238 |
| II | 50 | 50 | | | 183 | 216 |
| IV | 95 | | | 5 | 235 | 240 |
| V | 96.5 | | 3.5 | | 221 | 221 |
| VI | 10 | 90 | | | 275 | 302 |

The liquidus points of the bonding solders should be lower than the liquidus points of the high melting solders for the through hole fill. It is preferred that the difference between liquidus temperatures of the bonding solder be at least 20° C., and more preferably at least 40° C. lower than the liquidus temperatures of the fill solder. It may be inferred from the tables that common bonding solders, e.g. the Sn/Pb eutectic, have liquidus temperatures below 190° C. The higher melting point compositions in the table have liquidus temperatures above 210° C. In general, for the purposes of the invention the higher melting point solder used for the through hole fill will have a liquidus temperature above 200° C.

The double sided boards described here have through holes that extend completely through the board. Through hole interconnections are also used between levels in multilayer printed circuit boards, which are well known in the art and are a form of double sided board. This the term double sided board as used herein and in the appended claims is meant to apply to both single-level and multi-level boards.

The solder bodies used to attach and interconnect the substrates can be applied to either substrate or to both substrates. Solder bumps or balls are typically applied to one circuit board, e.g. in the BGA package of FIG. 5 the solder bodies are applied to the double sided circuit board.

The through hole solder fill can be applied by standard print solder paste and reflow techniques. If applied by print solder paste and reflow it is preferably applied to the bottom side of the board as previously described. The through hole filling step can be performed after copper through hole plating, or at any stage of board assembly prior to applying the low melting bonding solder.

It will be evident to those skilled in the art that the invention can be used with any double sided printed circuit board structure that uses through hole interconnections. It may be found most convenient to fill the through holes with higher melting point solder during manufacture of the boards, i.e. following drilling and through hole plating.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the assembly of multiple interconnection substrates in which at least one of said multiple interconnection substrates is a double sided circuit board with plated through holes extending through said double sided circuit board, the method comprising applying solder bodies made of a first solder material to at least one of said interconnection substrates and bonding said interconnection substrates together by melting said first solder material, the invention characterized by the step of filling said through holes with a second solder material prior to the step of bonding said interconnection substrates together, said second solder material having a liquidus point at least 20° C. higher than the liquidus point of said first solder material, and melting said first solder material at a temperature lower than the liquidus point of said second solder material.

2. The method of claim 1 in which the said solder bodies are solder bumps.

3. A method for attaching a double sided circuit board to an interconnection substrate wherein said double sided circuit board has at least one first interconnection site on the top side of said circuit board interconnected to a circuit on the top side of said circuit board, and at least one second interconnection site on the bottom side of said circuit board, and a plated through hole extending through said circuit board interconnecting said first interconnection site to said second interconnection sites, the method comprising the steps of:

a. filling said plated through hole with a first solder material, and b. attaching said circuit board to said interconnection board using an array of solder bumps of a second solder material wherein one of said array of solder bumps is attached to said second interconnection site of said circuit board, and wherein the liquidus temperature of said first solder material is at least 20° C. higher than the liquidus temperature of said second solder material.

4. The method of claim 3 in which the step of filling said through hole comprises applying the first solder material to said second interconnection site.

5. An interconnection assembly comprising a double sided circuit board attached to an interconnection substrate by an array solder bumps wherein said double sided circuit board has at least one first interconnection site on the top side of said circuit board interconnected to a circuit on the top side of said circuit board, and at least one second interconnection site on the bottom side of said circuit board, and a plated through hole extending through said circuit board interconnecting said first interconnection site to said second interconnection sites, the interconnection assembly characterized in that the through hole is filled with a first solder material having a liquidus temperature at least 20° C. higher than the liquidus temperature of said array of solder bumps, and one of said array of solder bumps is attached to said second interconnection site of said circuit board.

6. The assembly of claim 5 in which the said first interconnection site is an I/O pad of the circuit on the top side of the circuit board.

7. An interconnection assembly comprising a double sided circuit board with at least one first interconnection site on the top side of said circuit board and at least one second interconnection site on the bottom side of said circuit board, and at least one plated through hole extending through said circuit board interconnecting said first interconnection site to said second interconnection site, and an array of solder bumps attached to the bottom side of said circuit board said solder bumps comprising a first solder material, the interconnection assembly characterized in that the through hole is filled with a second solder material, the invention further characterized in that the liquidus temperature of said second solder material is at least 20° C. higher than the liquidus temperature of said first solder material.

8. The assembly of claim 7 in which the said first interconnection site is an I/O pad of the circuit on the top side of the circuit board.

9. The assembly of claim 7 in which the first solder material has a liquidus temperature below 190° C.

10. The assembly of claim 9 in which the second solder material has a liquidus temperature above 200° C.

11. The assembly of claim 7 in which the solder bumps are solder balls and the assembly is a ball grid array.

12. The assembly of claim 7 wherein the solder bumps are attached to said double sided circuit board with solder pads.

13. The assembly of claim 12 wherein the solder pads are located on at least one plated through hole.

* * * * *